United States Patent [19]
Cassista

[11] Patent Number: 5,959,493
[45] Date of Patent: Sep. 28, 1999

[54] TOTEM POLE DRIVER CIRCUIT

[76] Inventor: Philip A. Cassista, 6 Howard St., Nashua, N.H. 03060

[21] Appl. No.: 08/851,199

[22] Filed: May 5, 1997

Related U.S. Application Data

[60] Provisional application No. 60/019,050, May 6, 1996.
[51] Int. Cl.⁶ .......................... H03K 17/16; H03K 17/60
[52] U.S. Cl. .......................... 327/391; 327/486; 327/488
[58] Field of Search .................................. 327/110, 112, 327/168, 177, 374–377, 387, 391, 416, 434, 437, 433, 486, 488; 326/26, 81–85; 341/143

[56] References Cited

U.S. PATENT DOCUMENTS

| | | |
|---|---|---|
| 4,395,675 | 7/1983 | Toumani ................................. 323/271 |
| 4,559,590 | 12/1985 | Davidson ................................... 363/21 |
| 4,686,617 | 8/1987 | Colton ....................................... 363/56 |
| 4,706,177 | 11/1987 | Josephson ................................. 363/24 |
| 5,003,454 | 3/1991 | Bruning ..................................... 363/81 |
| 5,066,900 | 11/1991 | Bassett .................................... 323/224 |
| 5,109,186 | 4/1992 | Lieu ........................................ 323/299 |
| 5,132,888 | 7/1992 | Lo et al. ................................... 363/17 |
| 5,164,657 | 11/1992 | Gulczynski ............................. 323/275 |
| 5,233,508 | 8/1993 | Yamamura et al. ....................... 363/49 |
| 5,781,058 | 7/1998 | Sanzo et al. ............................. 327/387 |

*Primary Examiner*—My-Trang Nu Ton
*Attorney, Agent, or Firm*—Scott J. Asmus; Vernon C. Maine

[57] ABSTRACT

A totem pole driver circuit for driving N-channel Field Effect Transistors and Insulated Gate Bipolar Transistors, using a binary to decimal decoder/demultiplexer or a decoding analog multiplexer integrated circuit and signal transformers for switching the totem pole transistors, and employing a dead-time delay in the logic circuit to protect the transistors during switching.

21 Claims, 6 Drawing Sheets

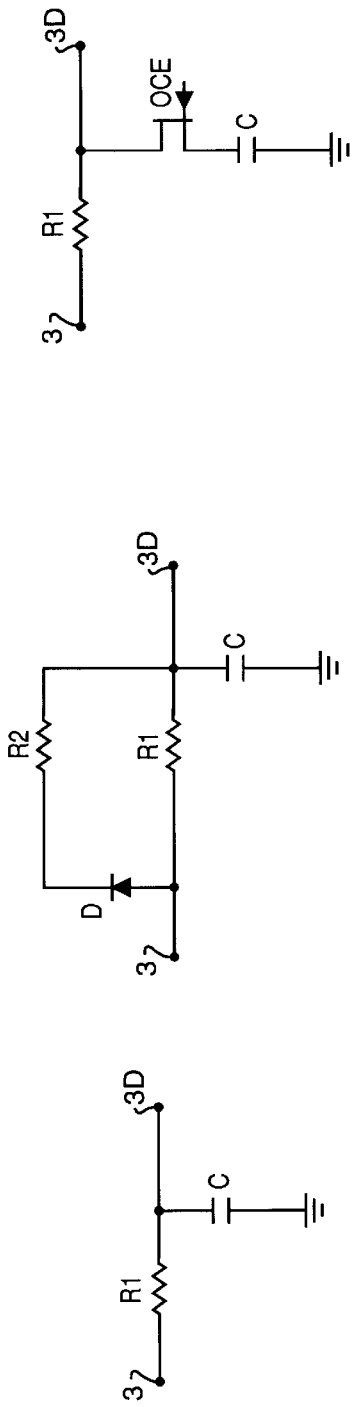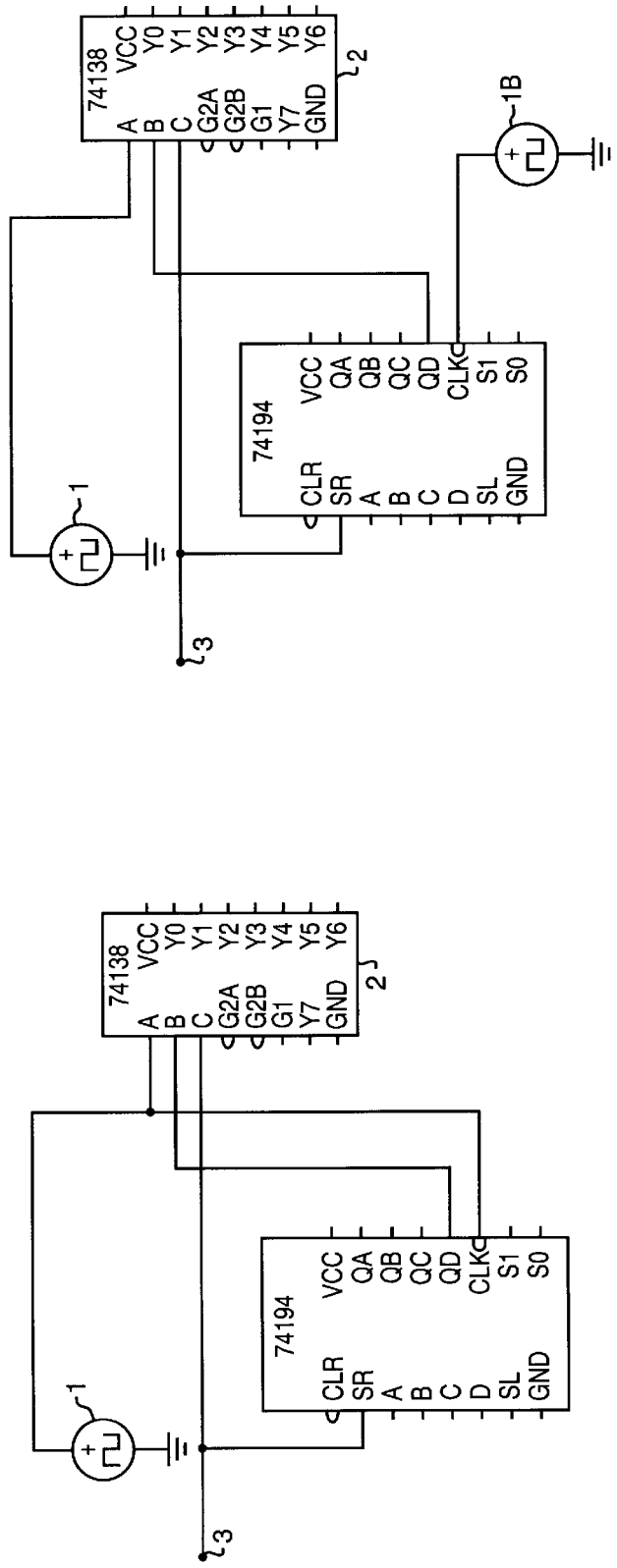

TOTEM POLE DRIVER CIRCUIT

This application is a continuation-in-part to pending patent application Ser. No. 60/019050, filed May 06, 1996 by the same applicant.

BACKGROUND OF THE INVENTION

1. Field of Invention

This invention relates to electronic circuits involving "totem pole" connected Field-Effect Transistors (FETs) or Insulated-Gate Bipolar Transistors (IGBTs).

2. Background Art

Connecting two FETs in series between two voltages allows the center connection to be switched to either supply voltage, provided that appropriate control voltages are connected to the gates of the two FETs. Such "totem pole" configurations of FETs are commonly used in high voltage and/or high current switching applications, such as in driving high voltage PIN diodes, controlling motors with "full-bridge" drivers, piezoelectric actuator drivers, and DC-DC power converters, among other uses.

Power FETs that are suited to the applications addressed herein are available as either N-channel or P-channel types. N-Channel devices are preferable to P-Channel types in terms of cost, breakdown voltage, and efficiency. but they require a control voltage which is more positive than the positive supply to be switched. This condition is sometimes not a problem in the case of the more negative of the two FETs in a totem pole pair, but usually the supply voltage connected to the positive-side FET is the most positive voltage available in the system.

In order to use an N-channel FET on the positive half of a totem-pole pair, then, frequently requires the generation of a voltage which is more positive than the highest voltage available in the system. Typically this voltage is generated by a DC-DC converter which has its negative output referenced to the positive supply voltage. In many cases it is necessary to generate a special voltage which is more positive, by a given amount, than the negative supply to be switched.

Additionally, totem pole FET configurations require a "dead time" during switching between the conduction phases of the two FETs to allow the off-going FET time to fully shut off. If an excessively high switching repetition rate is applied to the FET circuit, one or both FETs will be damaged if this "dead time" is not allowed for.

Integrated circuits are commercially available that incorporate capacitively coupled DC-DC converters to enable the use of FET totem pole architectures using only N-channel devices, but these IC's are only available for certain applications. Usually these IC's are configured as "high side" drivers, and they are therefore not useful when driving the negative side FET.

High-side voltages are usually generated by either capacitive or inductive means, and transformers are also sometimes used in this regard. Driver circuits are usually biased by these specially-generated voltages.

Opto-coupled FET drivers are available in IC form, and many designers create their own opto-coupled FET drivers by connecting an optoisolator to a FET driver. Optoisolation is used in these cases to allow freedom in level shifting of the control voltages to levels that are required by the FETs in a given application, as well as to eliminate feedback of potentially dangerous voltages spikes (which are generated by the switching of the FETs) to the control circuitry.

Currently available FET totem pole outputs typically switch directly to either one or the other voltage, and additional circuit complexity is required if it is desired to have either FET act as a "current source" or "current sink". A current source/sink style output is one in which the output current is made to be largely independent of the load voltage or it's dynamic characteristics.

In applications where FETs are used in high radiation environments, it is found that the Vgs(on) of the FETs will shift lower with increased exposure time, eventually to where a negative Vgs is required to shut off the FET completely. As a result of this, totem-pole FET circuits for use in these environments must be designed with provision for generating positive and negative Vgs control voltages, to provide enhanced robustness.

Some difficulties with the prior art are encountered when driving N-channel FETs in a totem pole configuration. These circuits tend to be fairly complex to perform each of the required functions correctly. Such circuits frequently must include "dead-time" and FET protection features which add to complexity. Many designs rely on optoisolators, which can be slow, large, and expensive. Protective isolation between the switching FETs and the control circuitry is sometimes necessary.

Many FET driver circuits require additional voltages to be created, and some of these circuits require large component. Typical FET driver circuits are not easily adapted to provide the positive and negative Vgs that is required in high radiation environments.

SUMMARY OF THE INVENTION

It is an object of this invention to provide a circuit which corrects many of the difficulties encountered when driving N-channel FETs in a totem pole configuration. Specifically, this circuit requires a very low parts count driver for FET totem pole circuits, and it provides inherent large, and expensive), but it does provide protective isolation between the switching FETs and the control circuitry.

It being understood that IGBTs may be used in lieu of FETs in many circuits, including those of the invention; for the purpose of this disclosure and the claims that follow, anywhere that the term FET is used to describe the totem pole transistors, the term IGBT with it's respective terminal designations may be used interchangeably. The terminal designations of an IGBT are Collector (corresponding to the FET Drain), Gate (corresponding to the FET Gate), and the Emitter (corresponding to the FET Source).

It will be further apparent to those skilled in the art that that although N channel FETs are illustrated herein, P channel FETs can also be used, provided that rectifying and gate discharging means have their polarities correctly reversed. It is therefore further intended and assumed for the purpose of this disclosure and the claims that follow, that the invention includes the use of P channel FETs for the totem pole transistors, with rectifying and gate discharging means having their polarities correctly reversed.

This circuit does not require additional voltages to be created, and it combines control signal transmission and voltage generation into one concept, which results in greater circuit simplicity. Additionally, the circuit presented herein is easily adapted to provide the positive and negative Vgs that is required in high radiation environments.

Central to this invention is the use of binary (or BCD) to decimal decoder/demultiplexer IC's, which are one of the more common TTL generic device types. They typically cost less than 50 cents apiece. The most common part of this type is the 74138, available in all TTL varieties (CMOS, Low Power Schottky, etc.). The most practical implementation of this circuit makes use of the CMOS varieties, such as the 74HC138, although the other families can also be used. It should be noted that some applications may make use of a decoder function block within a larger Programmable Array Logic (PAL) or other such device, and that this disclosure covers such implementations as well.

The CD4051 is a typical decoding analog multiplexer that can be used in place of the more common TTL decoder IC's. Decoding analog multiplexers can function as a drop-in replacement for TTL decoder IC's in many of the circuits described herein, simply by connecting the analog common pin to ground, or to ground through a resistor. Decoding analog multiplexers can also be applied in a slightly different way from TTL decoders, relative to this invention, in that the pulse train which need not be a TTL-level signal, can be applied to the analog common rather than to one of the decoder inputs.

Persons skilled in the art will recognize that the pulse train will then be applied to the various transformer primaries sequentially as the IC transmission paths sequentially become connected and disconnected from the analog common pin. Conversely, the pulse train or fluctuating voltage can be applied to one terminal of each of the transformer primaries simultaneously, and the remaining primary terminals of each transformer can each be connected to an I/O pin of the analog multiplexer.

The second device type which is integral to this disclosure is the signal transformer. These have become abundantly available in miniaturized form, and find common use in PC modems and telecommunications gear. The availability of these devices increases the practicality of this circuit.

A typical decoder IC follows a logic diagram as shown in Table 1 below, where A, B, C, and Enable are inputs, and 0–7 are outputs:

TABLE 1

| C | B | A | Enable | 0 | 1 | 2 | 3 | 4 | 5 | 6 | 7 |
|---|---|---|--------|---|---|---|---|---|---|---|---|
| L | L | L | L | L | H | H | H | H | H | H | H |
| L | L | H | L | H | L | H | H | H | H | H | H |
| L | H | L | L | H | H | L | H | H | H | H | H |
| L | H | H | L | H | H | H | L | H | H | H | H |
| H | L | L | L | H | H | H | H | L | H | H | H |
| H | L | H | L | H | H | H | H | H | L | H | H |
| H | H | L | L | H | H | H | H | H | H | L | H |
| H | H | H | L | H | H | H | H | H | H | H | L |
| X | X | X | H | H | H | H | H | H | H | H | H |

X = Don't care

As can be seen in FIG. 2, the schematic of the preferred embodiment, a constant pulse train or oscillator is applied to input A. This results in the outputs of the decoder toggling in pairs as shown in Table 2 below:

TABLE 2

| C | B | A | 0 & 1 | 2 & 3 | 4 & 5 | 6 & 7 |
|---|---|---|-------|-------|-------|-------|
| L | L | Pulsing | Pulsing | H | H | H |
| L | H | Pulsing | H | Pulsing | H | H |
| H | L | Pulsing | H | H | Pulsing | H |
| H | H | Pulsing | H | H | H | Pulsing |

The sequence of operations required to perform FET totem-pole switching can be broken down as follows:

1) Positive FET on

2) Positive FET actively shut off (this step left out in some FET driving circuits)
3) Negative FET on
4) Negative FET actively shut off (this step left out in some FET driving circuits)

Of course, in a situation where the Negative FET is on at the beginning of a cycle of interest, the list given above would start at step 3 and proceed cyclically through 3, 4, 1, 2, 3, 4, . . . etc.

These steps are easily accomplished with the decoder circuit in which the switch control input is connected to TTL input C, and B is driven by a delayed version of the switch control input (C). To those skilled in the art, it will be obvious that alternative decoder input pins can be used in this manner, resulting in an alternative ordering and/or pairing of outputs. For this discussion, the connectivity detailed herein is assumed. Some various means for generating the delayed signal are shown in FIG. 5, and additional alternatives will be obvious to those skilled in the art. It can be seen that in this configuration the signal conditions of the switching timing diagram of FIG. 1 would apply.

The enable function, whether it is implemented by the enable pin or by shutting off the pulse train to the decoder, provides an additional point of utility in that the user can cause the totem pole to completely shut off (and draw minimal supply current) when so desired. This "tri-state" capability allows the user to connect multiple totem pole circuits to the same load, and by logic level commands the user can determine which, if any, of the totem poles is active. Note that each totem pole may each be running from different supply rails, and/or their logic control (decoder "C" input, in our example) may each be different. An additional use of the enable function is conservation of system power.

The pulsing decoder output pairs are used to energize the primary windings of a set of signal transformers. Alternatively, a single decoder output may be connected directly, or via a buffering circuit (see FIG. 6), to one or the other terminals of the primary winding. The secondary winding of these transformers are rectified, and used to directly drive the switching FET gate-to-source junctions. The secondary windings are not typically referenced to ground, except in the case where one of the rails of the totem pole is actually ground.

Still other objects and advantages of the present invention will become readily apparent to those skilled in this art from the following detailed description, wherein I have shown and described only preferred embodiments of the invention, simply by way of illustration of the best mode contemplated by me on carrying out the invention.

BRIEF DESCRIPTION OF THE DRAWINGS

FIGS. 5A–5E is a set of schematic diagrams illustrating alternative means for generating delayed switch control inputs.

DESCRIPTION OF THE PREFERRED EMBODIMENT

Figure 1:
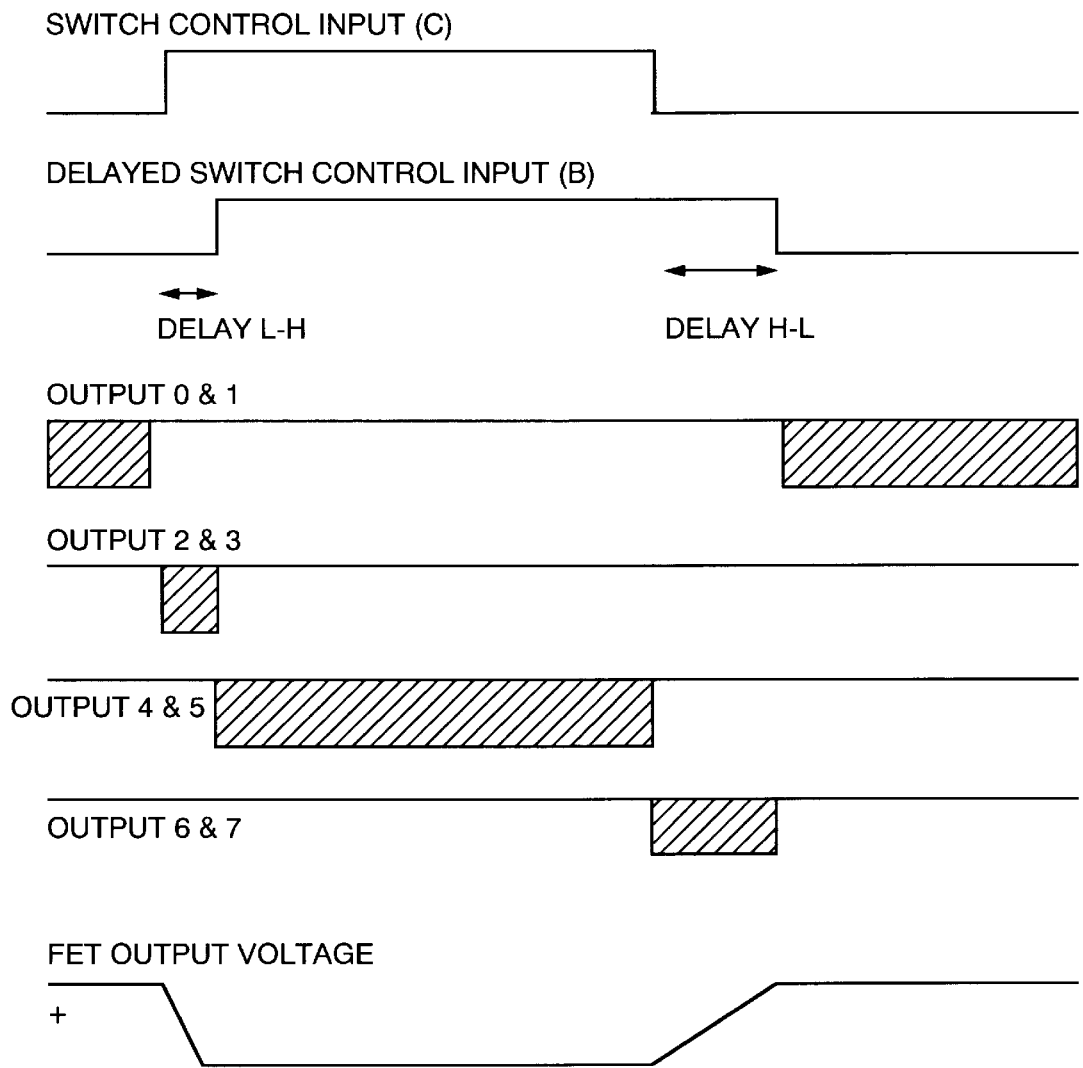
FIG. 1 is a timing diagram of key signal points within the circuit of FIGS. 2 and 3.
Figure 2:
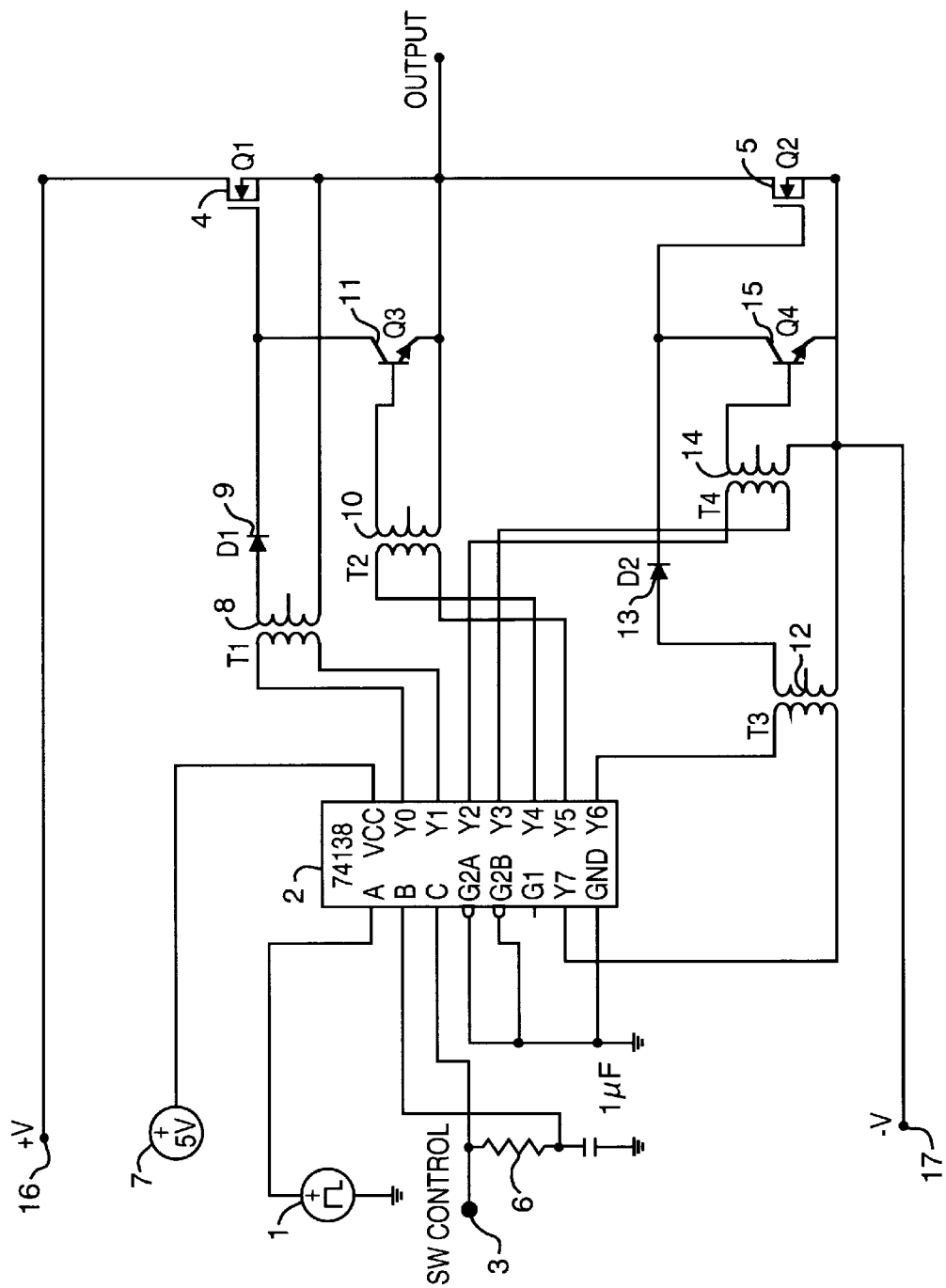
FIG. 2 is a schematic diagram of the preferred embodiment of the totem pole FET driver circuit.

FIG. 2 shows a basic implementation of this invention. Oscillator (1) is connected to decoder IC (2). The decoder IC is biased by the +5 V supply (7). Switch control input (3) accepts TTL commands to switch the FET totem pole, composed of high side FET Q1 (4) and low side FET Q2 (5). The switch control input is delayed by RC network (6) and this delayed signal is applied to another input of the decoder IC. The Y0 and Y1 outputs of the decoder IC are directly connected to the primary terminals of transformer T1(8).

The secondary of transformer T1 generates an alternating voltage when the primary is being driven, which is rectified by diode D1 (9). This rectified voltage, when available, is applied across the gate and source connections of the high side FET Q1 to cause it to conduct.

The decoder IC Y2 and Y3 outputs are connected to the primary terminals of transformer T2 (10). The secondary windings of transformer 12 are connected to the base-emitter junction of transistor Q3 (11).

When the primary of transformer T2 is energized, transistor Q3 will therefore conduct and tend to discharge any positive voltage on the gate of FET Q1, accelerating it's off-going transition. It should be noted that this gate discharging circuit is beneficial but not required in for either or both FETs in all implementations. Transistor Q3 and it's equivalent gate discharging transistor in other embodiments can be any form of transistor, including bipolar, and FET, with their respective terminals connected appropriately. The Y6 and Y7 outputs of the decoder IC are connected to transformer T3 (12) primary windings. When these outputs are pulsing, the secondary of transformer T3 generates an alternating voltage which is rectified by diode D2 (13) and applied to the gate-source junction of FET Q2, causing it to conduct.

Decoder IC outputs Y4 and Y5 are connected to transformer T4 (14) primary windings. The secondary windings of transformer T4 are connected to the base-emitter junction of conduct and tend to discharge any positive voltage on the gate of FET Q2, accelerating it's off going transition. The supply voltages applied to the FET totem pole are +V (16), which is the more positive supply, and negative voltage −V (17). The orientation of the supply voltage inputs to any circuit of the invention can be described as relatively more positive and relatively more negative, consistent with this example. The output connection (28) is the point at which this circuit could be connected to the load circuit or device (not shown).

This embodiment is typical of applications where the oscillator frequency is high enough such that the reactive impedance of the transformers limits the output current of the decoder outputs to appropriate magnitudes. The totem pole output in this circuit will switch directly to the +V and −V rails under control of the switch control input, and no provision is made to generate a negative Vgs for nuclear radiation robustness.

The use of transformers T1 through T4 results in a system which has high isolation from output stage to signal stage, which enhances circuit reliability. The component count is kept low in that there is no DC-DC level shifting required, since this function is inherent in the transformer signal transmission method. The use of an RC delay network in the logic portion of the circuit results in an inherent "dead time" during switching to protect the FETs, and this is implemented in a very economical way.

It should be reiterated that IGBTs with their corresponding terminal designations may be used in lieu of FETs in this and other embodiments for the totem pole transistors.

Figure 3:
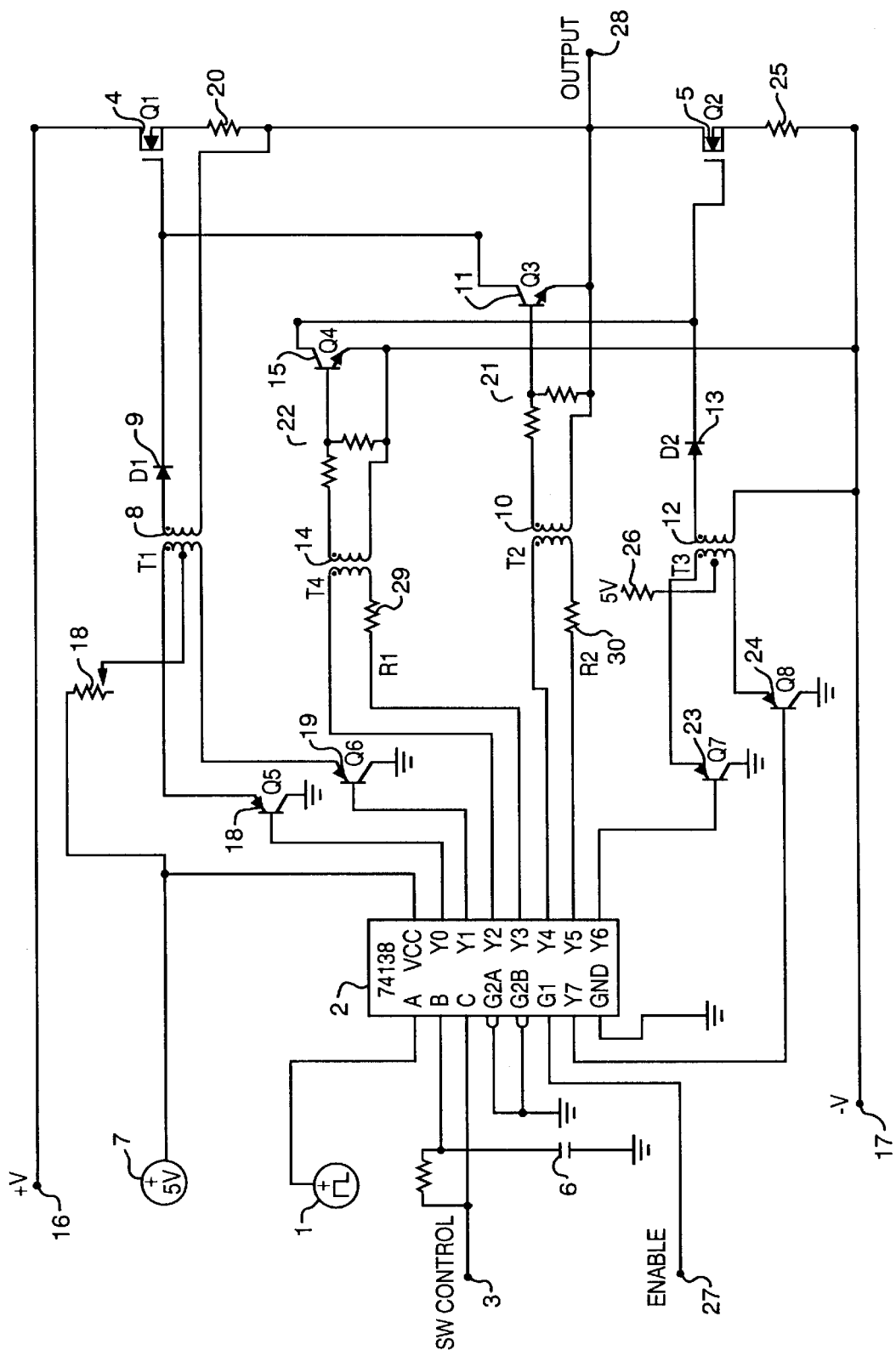
FIG. 3 is a schematic diagram of an enhanced variation of the circuit of FIG. 2, providing current source and current sink controls and additional components to improve circuit switching speed.

FIG. 3 shows a further embodiment of the invention, which shares many similarities with the previous figure. In this embodiment, transformer T1 is shown with a center tap on it's primary, and Q5 (18) and Q6 (19) are used to increase the current sinking capabilities of the outputs Y0 and Y1 of the decoder IC. Current for the primary circuit is controlled by the value of the adjustable resistor (18) which connects to the +5 V supply or a second biasing power source. Positive sense resistor (20) is connected to the source node of FET Q1. The rectified secondary voltage of transformer T1 is connected across the series combination of FET Q1 gate-source junction and the positive sense resistor.

This configuration allows for greater transformer primary current, and it allows the user to control the magnitude of the voltage which is resultant across Q1's gate-source junction and positive sense resistor. In this configuration, the user can adjust the adjustable resistor to set the magnitude of output current which FET Q1 can output, resulting in a current-source style positive output for the totem pole. Other means for adjusting the output current of the totem pole circuit will be readily apparent and applicable to the circuit, all within the scope of the invention.

Primary circuit current-limiting resistors R1 (29) and R2 (30) are inserted in the primary circuit of transformers T4 and T2 to control the drive level to their respective secondary side circuits. A resistive network (21) is connected between the secondary of T2 and the base-emitter junction of Q3, which limits the secondary current and aids in the shut-off of Q3.

A resistive network (22) is connected between the secondary of T4 and the base-emitter junction of Q4, which limits the secondary current and aids in the shut-off of Q3. Transformer T3 is shown with a center tap on it's primary, and Q7 (23) and Q8 (24) are used to increase the current sinking capabilities of the outputs Y6 and Y7 of the decoder IC. Current for the primary circuit is controlled by the value of the primary resistor (26) which connects to the +5 V supply. Negative sense resistor (25) is connected to the source node of FET Q2. The rectified secondary voltage of transformer T3 is connected across the series combination of FET Q2 gate-source junction and the negative sense resistor.

This configuration allows for greater transformer primary current, and it allows the user to set the magnitude of the voltage which is resultant across Q2's gate-source junction and negative sense resistor. In this configuration, the user can set the resistor to set the magnitude of output current which FET Q1 can output, resulting in a current-sink style negative output for the totem pole. An enable TTL input (27) is connected to the decoder IC to allow both output FETs to be forced to a non-conducting state, when a logic low is applied to this input. This provides a feature which can be used to protect the FETs and/or the load under excessive current conditions, for example.

This embodiment is typical of a relatively high-speed circuit which has a current source and current sink output and which has an enable input to force simultaneous shut-off of both output FETs. This shows how minor variations are possible which can provide great performance enhancements, owing to the particular design of the basic circuit.

Figure 4:
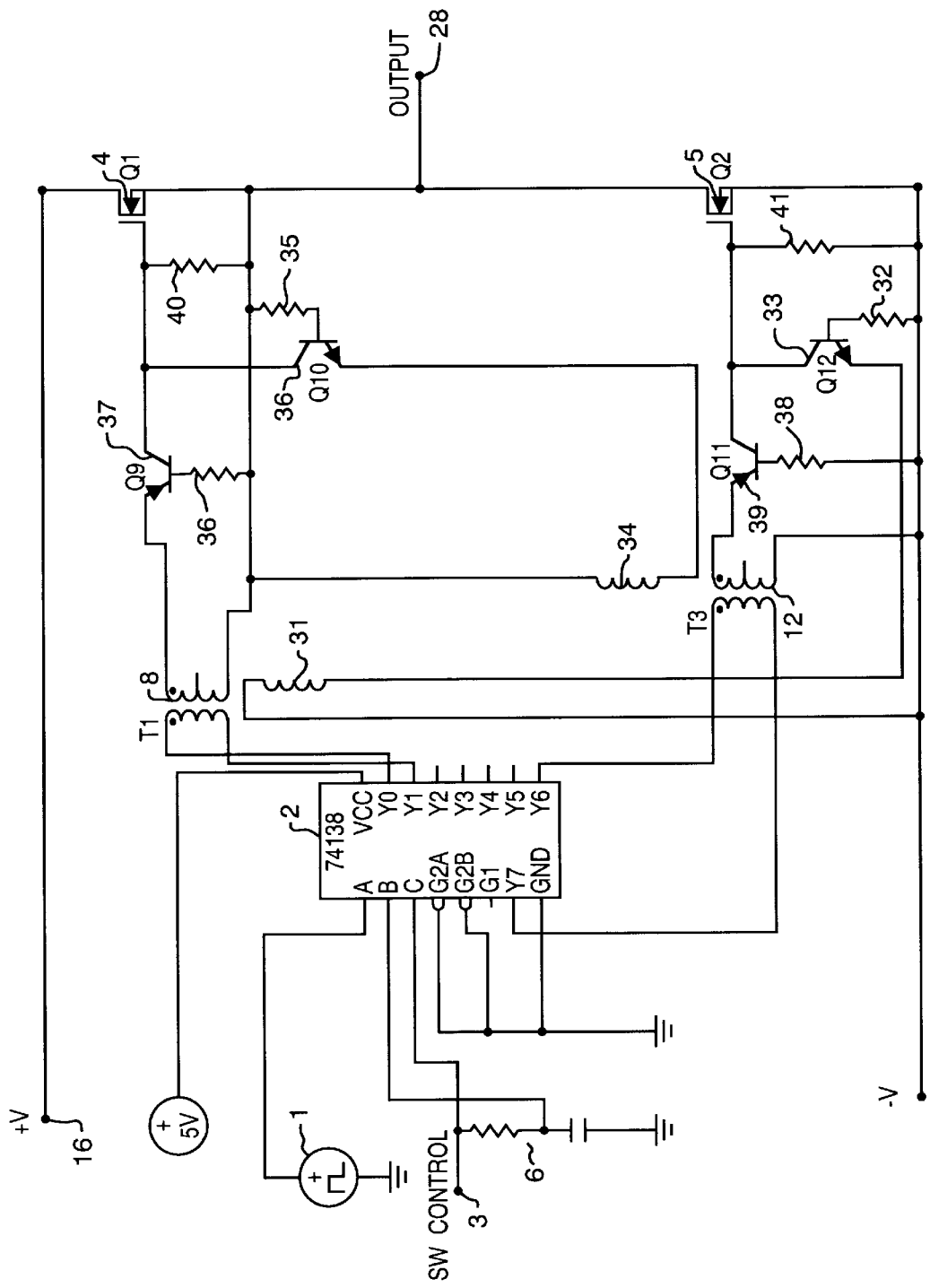
FIG. 4 is a schematic diagram of a variation of the circuit of FIG. 2, with negative voltage capability added to the gate drive circuits for enhanced robustness in high nuclear radiation environments.

FIG. 4 shares many similarities and components with FIG. 2. In this embodiment, though, transformers T2 and T4 are deleted, along with their secondary side components. Transformer T1 is shown with an additional secondary winding (31). This secondary winding is connected in series with a high-value current limiting resistor (32) and the base-emitter junction of transistor Q12 (33). The gate drive circuits for each side incorporate connections to the alternate side transformer.

This circuit has a modified form gate drive circuit from that of FIG. 2 and FIG. 3. Transformer T3 is shown with an additional secondary winding (34). This secondary winding is connected in series with a high-value current limiting resistor (35) and the base-emitter junction of transistor Q12 (36). The main secondary of transformer T1 is connected in series with a high-value current limiting resistor (36) and the base-emitter junction of transistor Q9 (37). The collectors of both Q9 and Q10 are connected together and to the gate of FET Q1. The main secondary of transformer T3 is connected in series with a high-value current limiting resistor (38) and the base-emitter junction of transistor Q11 (39). The collectors of both Q11 and Q12 are connected together and to the gate of FET Q2. FET Q1 is shown with a gate to source resistor (40), and there is a similar resistor (41) for FET Q2,.

This embodiment still employs a "dead-time" delay set by the RC network, but there is no active gate shut-off circuitry. Instead, the energizing of one transformer causes the additional secondary to create a negative Vgs for the other FET. This results in a simple circuit which is usefull for high-radiation environments.

In applications where it is desired to current-limit the positive and/or negative output current delivered by the totem pole circuit, this function can be easily implemented by interposing a resistor of appropriate value in the source connection of the FET to be current limited. By referencing the secondary side rectified negative voltage to the most negative end of this resistor, the effect is to provide negative feedback between the output current (as sensed by the voltage developed across the resistor) and the gate to source voltage, which tends to stabilize the current at the desired value when that FET is energized "on".

Another way of understanding this is to consider that the rectified secondary voltage is dependent mainly on the primary side energizing voltage and the transformer turns ratio. By inserting a current-setting resistor in the source of the FET, this rectified secondary voltage is distributed between both the gate to source voltage and the sense resistor voltage. The greater the sense resistor voltage is, the less voltage is left for the gate to source junction, which causes the FET to conduct less.

The result is that the output current is stabilized at a value which is dependent on the primary driving voltage, the transformer turns ratio, the Vgs(on) of the FET, and the value of the sense resistor. The output current in this configuration is therefore independent of the output loading.

The fact that the output pairs both switch to the same voltage level (logic high, typically) when not pulsing is advantageous in that there is no current flow in the non-energized transformers, keeping dissipation low.

The primary side circuits are easiest to implement when using a CMOS decoder, because these outputs can source and sink current. In the simplest application, there is no need for a series limiting resistor in the primary side of the transformers if the pulse train (A) frequency is high relative to the frequency response of the transformers. In applications where higher power is needed (for fast switching of large-gate FETs) in the gate driving circuits, or where a non-CMOS decoder is to be used, a center tapped primary can be used as shown.

More typical totem pole FET drivers use transformer- or capacitively- coupled circuits to generate one or more DC voltages which are referenced to the supply rails. These additional voltages are used by DC-coupled or Opto-coupled FET driver circuits to switch the FETs. The circuit described herein does not require these voltages, in that the signal to cause switching (the pulsing of a given output pair) also provides the level-shifted voltage to perform the switching.

Decoder IC's typically have enable or chip-select input pins which can be used as a shut-off for the totem pole circuit. Disabling the decoder by either of these methods causes all of the signal transformers to be de-energized, and the totem pole therefore goes into an all-off state (neither FET on). This can be used as a safety mechanism to protect the FETs and/or the load if excessive output current is detected, for example.

The dead-time delay can be independently set for the positive-going and negative-going transitions (such as by inserting a series diode/resistor pair in parallel with the single RC resistor shown in the diagrams), or for simplicity this feature can be ignored.

The use of active FET shut-off during transitions is useful in that this increases the speed of the totem pole and reduces the energy dissipated during switching.

Reverse bias on the off FET is necessary in designs that must be tolerant of nuclear radiation. The active shut-off pairs (typically outputs 2&3 and 4&5) can be used to generate reverse bias on the gates of the OFF FET, relying on the capacitance of the FET gates to maintain the voltage until the next cycle. Alternatively, the reverse-biasing scheme shown can be used. In this scheme the 0&1 and 6&7 transformers have dual secondaries and the 2&3 and 4&5 can be omitted. The additional secondaries are used as shown to generate negative gate voltages for whichever FET is off, using the same core and primary as is used to bias the other FET on.

FIG. 5A shows the method which is used in the preferred embodiments. It is simply an RC (resistor R1 and capacitor C) delay connected to switch control input 3, common in many analog timing and delay circuits. FIG. 5B shows the introduction of a diode D and resistor R2 to the basic RC circuit of FIG. 5A. These additional components allow the designer to separately set the off- and on-delay by adjustment of the two resistor values. Note that the diode D may be rotated to provide additional adjustability.

FIG. 5C introduces an opto-coupled element OCE into the RC delay of FIG. 5A, which can be used to provide a feedback path from a gate voltage monitoring circuit connected to the output FETs of the invention, or from another control circuit. This option is noted because in some cases it may be advantageous to have the delay time be adjustable, (for instance where the output loading is variable and it is desired to adjust the delay for best performance under all conditions).

FIG. 5D shows a digital implementation means of the delayed signal path from switch control input 3 to the delayed switch control input (B) of decoder 2, using 4 bit counter CTR whose clock input is driven by the pulse train 1 and whose set/reset input is connected to switch control input 3. The schematic shown is representative of the practice of counting a logic pulse train (in this case, for a duration of 16 pulses of the pulse train 1 input signal) and then applying the logic signal (which has been delayed in this instance for 16 clock pulses) to the decoder. Note that additional "glue" logic would likely be used, to allow for more complete control of the on- and off-going delays. FIG. 5E is similar to FIG. 5D except that an outside pulse source 1B, which can be unrelated to pulse train 1, is shown as the clock input of the counter CTR.

Figure 6E:
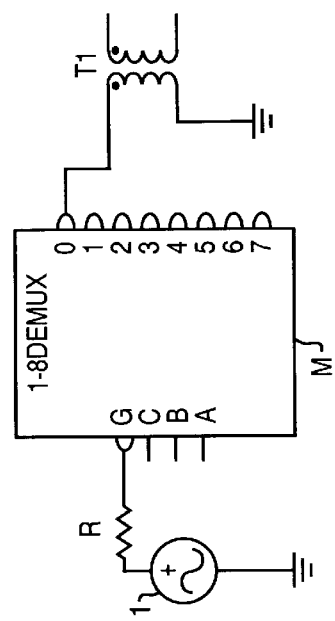
FIGS. 6A–6E is a set of schematic diagrams illustrating various decoder/primary winding coupling circuits, FIGS. 6A, B and E using passive element coupling, FIGS. 6C and D using buffering means.
Figure 6B:
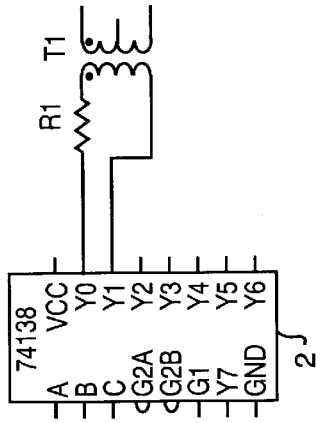
Figure 6D:
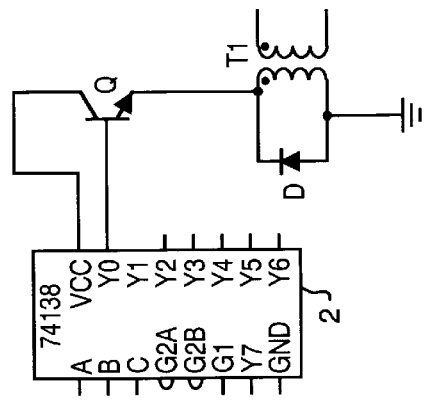
Figure 6A:
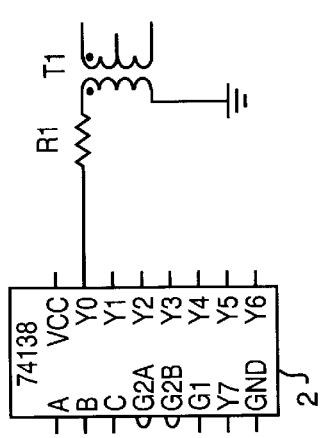

FIG. 6A shows a series resistor R1 connected to decoder 2, used to limit the primary DC current value in transformer T1 of FIG. 2, or any other transformer in this or other embodiments of the invention. Only one output Y0 of the available two pulsing outputs (Y0 and Y1 for the decoder shown) is shown in use. A capacitor and/or an appropriate passive network of multiple elements can also be used in place of the single resistor R1 shown in this figure and in FIGS. 6B and E.

Figure 6C:
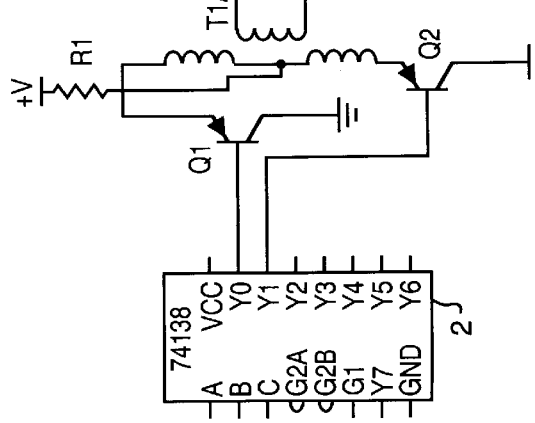

FIG. 6B is similar to FIG. 6A except that both of the pulsing output pairs Y0 and Y1 are used. This allows a greater power transfer by using two outputs instead of one, and in some cases it improves the performance of transformer T1 by reducing saturation effects. FIG. 6C uses a tapped primary (typically center-tapped) transformer T1A in a method which allows amplification of the available current of logic outputs Y0 and Y1 into T1A, by the use of two transistors Q1 and Q2, shown here as emitter-followers. The magnitude of the primary current is set by the single resistor R1 which feeds the primary tap and/or by adjusting the voltage +V applied to resistor R1. It is important to note that voltage +V can be an independent and variable voltage source, as distinguished from the +5 volt source 7 of FIG. 3. This circuit is useful in cases where it is desired to adjust the magnitude of the secondary (gate-drive) voltage of transformer T1A.

FIG. 6D shows another implementation of transistor-buffering of the logic-level output of the decoder 2. The diode D shown clamps the inductive ringing from the primary of multiplexer M is used in place of a decoder, it can be advantageous to introduce the buffering method, shown here as pulse train 1 and resistor R, in the analog common input of the multiplexer M, the output shown connected directly to T1. This reduces circuit complexity because only one buffering circuit is needed, and it is essentially shared among all of the transformers in the circuit. Also, the signal can be of much higher frequency than is practical with a TTL decoder, up to several hundred Megahertz. The higher frequency reduces the required transformer size, and the signal source can be non-TTL level and of adjustable amplitude, if desired.

As will be realized, the invention is capable of other and different embodiments, and its several details are capable of modifications in various obvious respects, all without departing from the invention.

What is claimed is:

1. An improved totem pole circuit comprising:
   a relatively positive supply voltage;
   a relatively negative supply voltage;
   a biasing power source;
   a decoder connected to said bias power source;
   a means for generating a pulse train connected to said decoder,
   a switch control input connected to said decoder, wherein said switch control input has a means for generating a delayed switch control input;
   a pair of FETs connected in a totem pole configuration, said pair consisting of a high side FET and a low side FET, wherein said high side FET has a gate, a source, and a drain and said relatively positive supply voltage is connected to said drain of said high side FET and an output is connected to said source of said high side FET, and wherein said low side FET has a gate, a source, and a drain and said relatively negative supply voltage is connected to said source of said low side FET and said output is connected to said drain of said low side FET; and
   a pair of gate charging transformers each with a primary and a secondary wherein said primary of each of said transformers is connected to a corresponding output of said decoder and said secondary of each of said transformers is connected to a respective means for rectifying a gate-source connection of each of said pair of FETs.

2. The improved totem pole circuit of claim 1, wherein said decoder is a decoding analog multiplexer.

3. The improved totem pole circuit of claim 1, further comprising a pair of gate discharging transformers, each having a primary, and a secondary, and a pair of gate discharging transistors, each having a base, an emitter, and a collector, wherein said primary of each of said gate discharging transformers is connected to a corresponding output of said decoder and said secondary of each of said transformers is connected across a base-emitter junction of each of said gate discharging transistors, said collector of each of said gate discharging transistors connected to said gate of each of said pair of FETs, and said emitter of each of said gate discharging transistors connected to said source of each of said pair of FETs.

4. The improved totem pole circuit of claim 1 wherein said means for generating said delayed switch control input is an RC circuit connected to said switch control input.

5. The improved totem pole circuit of claim 1, wherein said means for generating said delayed switch control input is a gate voltage monitoring circuit connected to said switch control input.

6. The improved totem pole circuit of claim 1, wherein said means for generating said delayed switch control input is a digital implementation means connected to said switch control input.

7. The improved totem pole driver circuit of claim 1, wherein an enable input is connected to said decoder.

8. An improved totem pole circuit comprising:
   a relatively positive supply voltage;
   a relatively negative supply voltage;
   a biasing power source;
   a decoder connected to said biasing power source;
   a means for generating a pulse train connected to said decoder;
   a switch control input connected to said decoder wherein said switch control input has a means for generating a delayed switch control input;
   a pair of FETs connected in a totem pole configuration, said pair consisting of a high side FET and a low side FET, wherein said high side FET has a gate, a source, and a drain and said relatively positive supply voltage is connected to said drain of said high side FET and an output is connected to said source of said high side FET, and wherein said low side FET has a gate, a source, and a drain and said relatively negative supply voltage is connected to said source of said low side FET and said output is connected to said drain of said low side FET;
   a pair of gate charging transformers each with a primary and a secondary wherein said primary of each of said transformers is connected to a corresponding output of said decoder and said secondary of each of said transformers is connected to a respective means for rectifying a gate-source connection of each of said pair of FETs; and a pair of gate discharging transformers, each having a primary, and a secondary, and a pair of gate discharging transistors, each having a base, an embitter, and a collector, wherein said primary of each of said gate discharging transformers is connected to a corresponding output of said decoder and said secondary of each of said transformers is connected across a base-emitter junction of each of said gate discharging transistors, said collector of each of said gate discharging transistors connected to said gate of each of said pair of FETs, and said emitter of each of said gate discharging transistors connected to said source of each of said pair of FETs.

9. The improved totem pole circuit of claim 8, further comprising a means for adjusting output current.

10. The improved totem pole circuit of claim 9, wherein said means for adjusting output current is a sense resistor connected to a gate-source circuit of either of said FETs.

11. The improved totem pole circuit of claim 8, further comprising a passive network connected between said biasing power source and a tap on said primary of at least one of said gate charging transformers.

12. The improved totem pole circuit of claim 8, further comprising a second biasing power source connected to a tap on said primary of at least one of said gate charging transformers.

13. The improved totem pole circuit of claim 8, further comprising a passive network connected between said secondary of at least one of said pair of gate discharging transformers and a base-emitter junction of at least one of said pair of gate discharging transistors.

14. The improved totem pole circuit of claim 8, wherein an enable input is connected to said decoder.

15. The improved totem pole circuit of claim 8, wherein said means for generating said delayed switch control input is an active gate voltage monitoring circuit.

16. The improved totem pole circuit of claim 8, wherein said means for generating said delayed switch control input is a digital implementation means.

17. The improved totem-pole circuit of claim 8, further comprising a buffering means connected to each said primary of said gate discharging transformers.

18. An improved totem pole circuit comprising:

a relatively positive supply voltage;

a relatively negative supply voltage;

a biasing power source;

a decoder connected to said biasing power source;

a means for generating a pulse train connected to said decoder;

a switch control input connected to said decoder;

a pair of gate charging transformers each having a primary, a main secondary and an additional secondary, wherein each primary of said pair of gate charging transformers is connected to corresponding outputs of said decoder;

a pair of FETs connected in a totem pole configuration, said pair consisting of a high side FET and a low side FET, wherein said high side FET has a gate, a source, and a drain and said relatively positive supply voltage is connected to said drain of said high side FET and an output connected to said source of said high side FET, and wherein said low side FET has a gate, a source and a drain and said relatively negative supply voltage is connected to said source of said low side FET and said output is connected to said drain of said low side FET;

a gate drive circuit comprising a PNP transistor and an NPN transistor, each said transistor with a collector, base and an emitter, and each said transistor having a resistor connected between said base and said source of one of said pair of FETs, and said collector of each transistor connected to said gate of said one of said pair of FETs, said emitter of said PNP transistor connected to a first terminal of said main secondary, a second terminal of said main secondary connected to said source of said one of said pair of FETs, said emitter of said NPN transistor connected to a first terminal of said additional secondary, a second terminal of said additional secondary connected to said source of said one of said pair of FETs.

19. The improved totem pole circuit of claim 18, further comprising a pair of gate drive circuits connected to each of said pair of FETs.

20. The improved totem pole circuit of 18, further comprising a means for generating a delayed switch control input.

21. The improved totem pole circuit of claim 18, wherein an enable input on said decoder is used to shut off the totem pole circuit.

* * * * *